(12) United States Patent  
Tsinker

(10) Patent No.: US 7,567,071 B1  
(45) Date of Patent: Jul. 28, 2009

(54) CURRENT AND VOLTAGE SOURCE THAT IS UNAFFECTED BY TEMPERATURE, POWER SUPPLY, AND DEVICE PROCESS

(75) Inventor: Vadim Tsinker, Belmont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 30 days.

(21) Appl. No.: 11/126,521

(22) Filed: May 10, 2005

(51) Int. Cl.  
G05F 3/26 (2006.01)  
H03K 3/011 (2006.01)

(52) U.S. Cl. .................... 323/316; 331/144; 331/113 R

(58) Field of Classification Search .................. 323/316, 323/317, 313, 314; 327/182; 331/144, 113 R  
See application file for complete search history.

(56) References Cited

U.S. PATENT DOCUMENTS

| | | | | |
|---|---|---|---|---|
| 5,352,934 A | * | 10/1994 | Khan | 327/538 |
| 6,020,792 A | * | 2/2000 | Nolan et al. | 331/111 |
| 6,157,270 A | * | 12/2000 | Tso | 331/176 |
| 6,356,161 B1 | * | 3/2002 | Nolan et al. | 331/176 |
| 6,724,176 B1 | * | 4/2004 | Wong et al. | 323/316 |
| 6,917,249 B1 | * | 7/2005 | Kuo et al. | 331/143 |
| 7,034,627 B1 | * | 4/2006 | Kudari | 331/143 |
| 7,071,767 B2 | * | 7/2006 | Ou-yang et al. | 327/539 |

* cited by examiner

Primary Examiner—Akm E Ullah  
Assistant Examiner—Harry Behm

(57) ABSTRACT

An integrated circuit in accordance with one embodiment of the invention includes an oscillator circuit and a source circuit. The source circuit outputs a reference voltage and a bias current, wherein the reference voltage changes by substantially the same proportion as the bias current. The oscillator circuit is coupled to receive the reference voltage and the bias current from the source circuit. The oscillator circuit outputs an oscillating electrical signal.

12 Claims, 7 Drawing Sheets

| Temp. Celsius | A | Vbe | B | (A·B) | C | (A·B)+C |
|---|---|---|---|---|---|---|
| 0 | 0.003242 | 0.5448 | 3037.605 | 9.8471806 | -0.8855 | 8.961681 |
| 10 | 0.00329 | 0.5208 | 2903.79 | 9.552749765 | -0.5313 | 9.02145 |
| 20 | 0.003334 | 0.4968 | 2769.974 | 9.236399541 | -0.1771 | 9.0593 |
| 30 | 0.003376 | 0.4728 | 2636.159 | 8.900300165 | 0.1771 | 9.0774 |
| 40 | 0.003415 | 0.4488 | 2502.344 | 8.546344526 | 0.5313 | 9.077645 |
| 50 | 0.003452 | 0.4248 | 2368.529 | 8.176191101 | 0.8855 | 9.061691 |
| 60 | 0.003486 | 0.4008 | 2234.714 | 7.79129915 | 1.2397 | 9.030999 |
| 70 | 0.003519 | 0.3768 | 2100.899 | 7.392957757 | 1.5939 | 8.986858 |

CURRENT AND VOLTAGE SOURCE THAT IS UNAFFECTED BY TEMPERATURE, POWER SUPPLY, AND DEVICE PROCESS

BACKGROUND

Integrated circuits are utilized in a wide variety of applications. For example, integrated circuits are found within computer systems, mobile telephones, portable digital music players, and automobiles, to name a few. One of the components that can be fabricated as part of an integrated circuit is an oscillator circuit that produces an oscillating electrical signal. One common type of oscillator circuit is a resistor capacitor (RC) oscillator circuit.

It is appreciated that circumstances can arise where it becomes desirable to produce an RC oscillator circuit wherein all its components are located on an integrated circuit chip. Furthermore, it can also be desirable to have that RC oscillator have a frequency tolerance better than +/−25% while being unaffected by variations in temperature and/or variations in its power supply. However, conventional techniques for producing an RC oscillator are typically unable to meet these particular criteria.

SUMMARY

An integrated circuit in accordance with one embodiment of the invention includes an oscillator circuit and a source circuit. The source circuit outputs a reference voltage and a bias current, wherein the reference voltage changes by substantially the same proportion as the bias current. The oscillator circuit is coupled to receive the reference voltage and the bias current from the source circuit. The oscillator circuit outputs an oscillating electrical signal.

BRIEF DESCRIPTION OF THE DRAWINGS

FIG. 3 is an exemplary table in accordance with embodiments of the invention.

DETAILED DESCRIPTION

Reference will now be made in detail to embodiments in accordance with the invention, examples of which are illustrated in the accompanying drawings. While the invention will be described in conjunction with embodiments, it will be understood that these embodiments are not intended to limit the invention. On the contrary, the invention is intended to cover alternatives, modifications and equivalents, which may be included within the scope of the invention as defined by the appended claims. Furthermore, in the following detailed description of embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
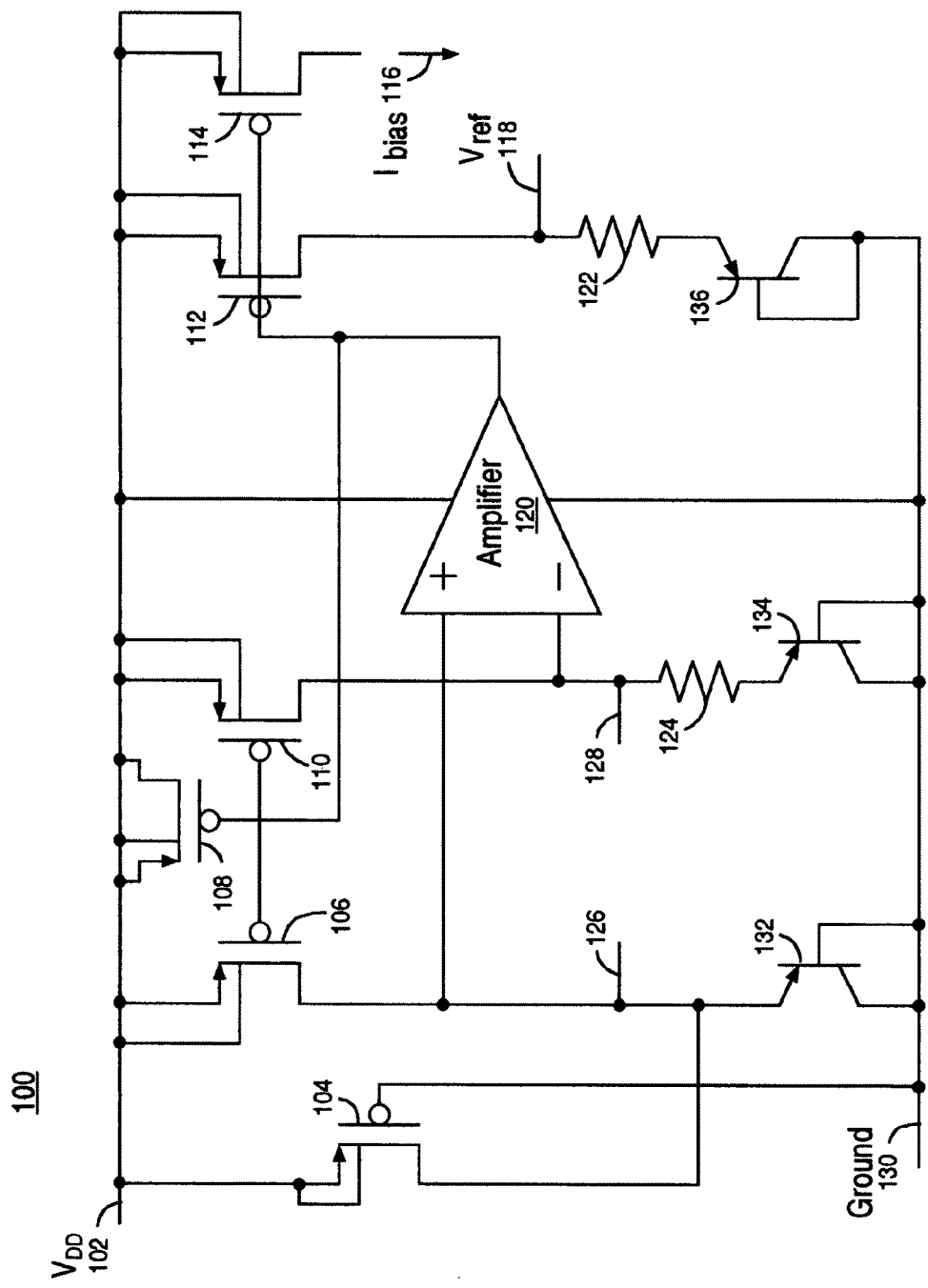
FIG. 1 is a schematic of an exemplary circuit in accordance with embodiments of the invention.

FIG. 1 is a schematic of an exemplary current and voltage source circuit 100 in accordance with embodiments of the invention that can be substantially unaffected by variations in temperature, power supply, and transistor process. Note that circuit 100 can output a bias current ($I_{bias}$) 116 and a reference voltage (Vref) 118 to other circuitry, such as, but not limited to, a dual oscillator circuit 500 of FIG. 5, which is described below. In this manner, oscillator circuit 500 can have an improved operating tolerance. Note that all of the elements of circuit 100 can be implemented as part of (or internal to) an integrated circuit chip. Also, circuit 100 can be referred to as an integrated circuit design. It is understood that circuit 100 is an exemplary bandgap reference circuit. However, embodiments of the invention can be implemented with any bandgap reference circuit configuration having a biasing point as described herein. Understand that the biasing point or operating point of circuit 100 can be implemented such that its output reference voltage 118 changes by substantially the same proportion as its output bias current 116.

In one embodiment, circuit 100 can be adjusted such that it is less affected by variations in temperature, power supply, and/or transistor process by determining its proper biasing point associated with its output voltage reference 118 with respect to its output bias current 116.

Within circuit 100 of FIG. 1, an amplifier circuit 120 is coupled to nodes 126 and 128 and it tries to keep the voltage difference between them at zero volts. By keeping nodes 126 and 128 at substantially a zero voltage difference, it results in substantially equal current flowing through both node 126 and node 128. Specifically, the current (I) flowing through node 126 and node 128 can be equal to that shown in Equation 1:

$$I = Vt \cdot \frac{\ln(n)}{R} \quad (1)$$

where "Vt" is the thermal voltage, "R" is equal to the resistance of resistor 124, and "n" is equal to the size ratio of transistor 134 divided by transistor 132. In one embodiment, the size of transistor 134 can be eight times larger than the size of transistor 132. However, transistors 132 and 134 can be sized in any manner. Note that Equation 1 is based on the condition that a virtual ground exists between nodes 126 and 128 and a substantially equal current flows through node 126 and node 128 into each of bipolar transistors 132 and 134, respectively. The substantially equal current condition can be insured by having substantially equal sized current mirror transistors 106 and 110 where each of nodes 126 and 128 is at substantially the same voltage potential. When the current of Equation 1 (or a portion of it) is delivered to the series combination of resistor 122 and bipolar transistor 136, the generated output reference voltage (Vref) 118 for circuit 100 can be equal to that shown in Equation 2:

$$Vref = I \cdot R \cdot X + Vbe \quad (2)$$

where "R" is equal to the resistance of resistor 122, "X" provides the scaling (or multiplier) of the resistance of resistor 122 to the resistance of resistor 124, "Vbe" is the base-emitter voltage of bipolar transistor 136, and "I" is the current flowing through node 126 and node 128, which is shown by Equation 1. Note that transistor 136 can be implemented to be substantially the same size as transistor 132 while resistor 122 can be implemented to be substantially the same resistance as resistor 124. However, transistors 132 and 136 and resistors 122 and 124 can be sized in any manner. It is understood that Equation 2 can be rewritten by substituting Equation 1 for the "I" term of Equation 2, thereby resulting in Equation 3:

$$Vref = Vt \cdot (\ln(n) \cdot X) + Vbe = \Delta V \quad (3)$$

where "Vt" and "n" are the same as mentioned above. Note that Vref is also equal to the change of voltage "$\Delta V$".

In order to tune circuit 100 such that it is substantially unaffected by temperature, power supply, and transistor process, it is desirable to minimize the curvature of the theoretical period of an oscillator that can be coupled to it. Understand that an oscillator can be implemented by establishing a current source and a voltage reference point. A current source can generate a voltage ramp, which at some point will reach an established reference voltage. A comparator can detect this condition and reset the ramp back to zero, thereby starting the cycle over. The period of this ramp cycle can be derived from Equation 4:

$$I = C \cdot \frac{\Delta V}{\Delta t} \quad (4)$$

where "C" is the capacitance of the oscillator, "$\Delta V$" is equal to the change in voltage of the oscillator, and "$\Delta t$" is equal to the period of the ramp. As such, the period of the ramp is equal to Equation 5:

$$\Delta t = \text{Period} = C \cdot \frac{\Delta V}{I} \quad (5)$$

where "$\Delta t$" is equal to the period of the ramp. Note that for a dual oscillator circuit 500 of FIG. 5, the period generated by the ramp is a half period or Period/2. Additionally, substituting Equation 1 for the "I" term of Equation 5 can modify Equation 5. Also, Equation 3 can be substituted for the "$\Delta V$" term of Equation 5. As such, the result is shown as Equation 6:

$$\frac{\text{Period}}{2} = C \left( R \cdot X + \frac{(Vbe \cdot R)}{Vt \cdot \ln(n)} \right) \quad (6)$$

It is appreciated that Equation 6 can be rewritten as shown in Equation 7:

$$\frac{\text{Period}}{2} = C \cdot R \left( X + \frac{Vbe}{Vt \cdot \ln(n)} \right) \quad (7)$$

Understand that the "R" of Equation 7 can be defined as shown in Equation 8:

$$R = R_{abs}(1 + Kr \cdot T_c) \quad (8)$$

where "$R_{abs}$" is equal to the absolute resistance, "Kr" is equal to the resistor temperature coefficient of resistor 124, and "$T_c$" is equal to the change in degrees Celsius. Note that the 2nd order temperature coefficient (not shown) of Equation 8 can be ignored since its effect is minor with respect to "R". Equation 8 can be substituted for the "R" term of Equation 7, thereby resulting in Equation 9:

$$\frac{\text{Period}}{2} = C \cdot R_{abs} \left( X + Kr \cdot T_c \cdot X + \frac{Vbe}{Vt \cdot \ln(n)} + \frac{Kr \cdot T_g Vbe}{Vt \cdot \ln(n)} \right) \quad (9)$$

It is understood that Vt can be equal to Equation 10:

$$Vt = \frac{k \cdot T_k}{q} \quad (10)$$

where "$T_k$" is the temperature in degrees Kelvin, "q" is equal to the electron charge value of $1.6 \times 10^{-19}$ Coulombs, and "k" is equal to the Boltzmann constant of $1.38 \times 10^{-23}$ J/° K. As such, Equation 10 can be substituted for the "Vt" terms within Equation 9, thereby results in Equation 11:

$$\frac{\text{Period}}{2} = C \cdot R_{abs} \left[ X + (Kr \cdot T_c \cdot X) + \left( \frac{Vbe \cdot q}{k \cdot \ln(n)} \right) \left( \frac{1}{T_k} + Kr \cdot \frac{T_c}{T_k} \right) \right] \quad (11)$$

It is pointed out that Equation 11 is independent of variations in supply voltage since there is no supply voltage variable within it. Note that the following equation terms can be selected from the Equation 11:

$$A = \frac{1}{T_k} + Kr \cdot \frac{T_c}{T_k}$$

$$B = \frac{Vbe \cdot q}{k \cdot \ln(n)}$$

$$C = Kr \cdot T_c \cdot X$$

where it is desirable to have the total value of "$(A \cdot B) + C$" result in minimal variation over a selected temperature range. However, in order to make this determination, the different values of Vbe across the selected temperature range can be determined. It is noted that there are diverse ways to determine the values of Vbe across the selected temperature range.

Figure 2:
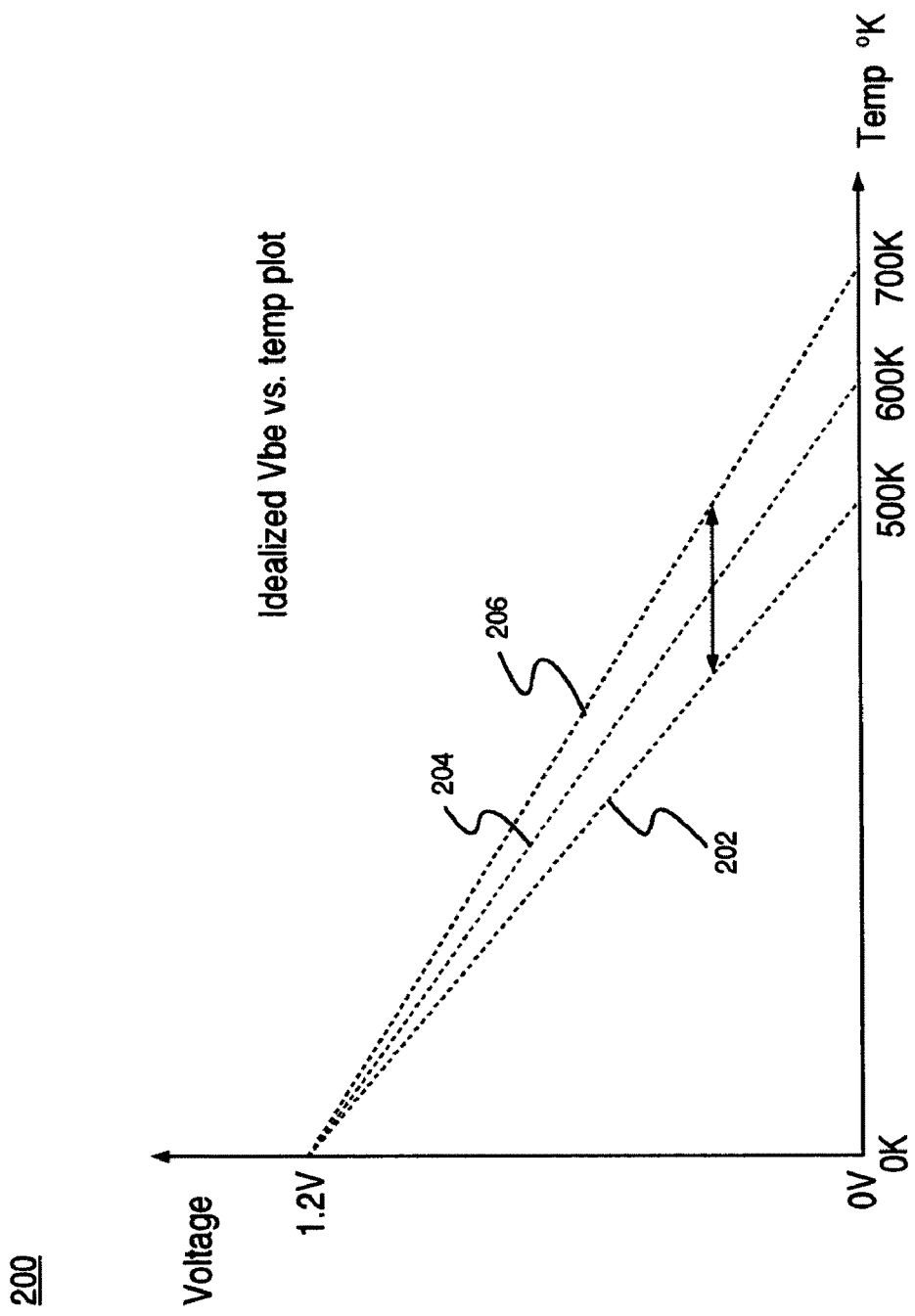
FIG. 2 is an exemplary graph in accordance with embodiments of the invention.

In one embodiment, the value of Vbe at different temperatures can be determined by utilizing a plot of idealized Vbe values versus temperature. For example, FIG. 2 is an exemplary graph 200 of an idealized Vbe versus temperature plot in accordance with embodiments of the invention. Specifically, graph 200 includes lines 202, 204, and 206 that can each be separately used to determine the value of Vbe at different temperatures. Note that if the desirable temperature range is from zero to 70 degrees Celsius, for example, it can be assumed that the variation of Vbe is linear, even though a true Vbe versus temperature plot does curve at both ends, the curvature is slight. As such, it can be assumed that the value of Vbe obeys or follows one of lines 202, 204, and 206 of graph 200. Therefore, the value of Vbe can be determined at different corresponding temperature values.

For example, given the temperature value of 333.15° K, one of lines 202, 204, and 206 of graph 200 can be utilized to determine the corresponding value of Vbe, e.g., substantially equal to 0.4008 volts (V). It is noted that a temperature in degrees Celsius can be converted to a temperature in degrees Kelvin by adding the value of 273.15 to that Celsius temperature value. For example, the temperature of 10° C. can be converted into Kelvin by adding the value of 273.15 to the Celsius temperature value of 10, thereby resulting in 283.15° K.

Within FIG. 2, it is understood that lines 202, 204, and 206 of graph 200 each represents idealized values of Vbe versus temperature. As such, each of lines 202, 204, and 206 can alternatively be utilized to determine or ascertain the value of Vbe at different temperature values.

It is understood that Vbe can be determined in a wide variety of ways besides utilizing graph 200. For example, Vbe values across a temperature range can be determined by modeling the bipolar device across the temperature range.

Now that values for Vbe can be determined across a desired temperature range from graph 200, the other known values of equation terms "A", "B", and "C" can be inserted into them at different temperatures of the desired range. Note that this progress is described in more detail below with reference to FIGS. 3 and 4.

Within FIG. 1, circuit 100 can include a transistor 104 that provides a bleeder current to node 126. In this manner, transistor 104 provides a mismatch of current to node 126 so that nodes 126 and 128 do not reach a zero conduction condition. Specifically, the source of transistor 104 can be coupled to a voltage source ($V_{DD}$) 102 while its gate can be coupled to a voltage ground 130. As such, transistor 104 is able to constantly remain "on" and conducting current. Note that transistor 104 can be implemented such that it provides a weak current (e.g., 1 microampere) to node 126 via its drain. For example in one embodiment, transistor 104 can be implemented having a width of 1 micrometer (or micron) and a length of 60 micrometers (or microns), but is not limited to such.

Within circuit 100, ideally the current in node 126 and node 128 are substantially the same since circuit 100 includes current mirror transistors 106 and 110. If the current in node 126 and node 128 are the same, than transistors 106 and 110 are operating under substantially the same conditions.

Within FIG. 1, transistor 114 can be coupled to transistor 112 such that transistor 114 is a current mirror. The drain of transistor 114 can provide the output bias current 116 to other circuitry, such as, dual oscillator circuit 500 of FIG. 5, but is not limited to such.

The source of transistor 104 can be coupled to voltage source ($V_{DD}$) 102 having a high voltage value (e.g., logic "1"), its gate can be coupled to voltage ground 130 having a low voltage value (e.g., logic "0"), and its drain can be coupled to node 126 and the emitter of transistor 132. The base and collector of transistor 132 can be coupled to ground 130. The source of transistor 106 can be coupled to $V_{DD}$ 102 while its gate can be coupled to the output of amplifier 120 and the gates of transistors 108, 110, 112 and 114. The drain of transistor 106 can be coupled to node 126 and to the positive input of amplifier 120. The source and drain of transistor 108 can be coupled to $V_{DD}$ 102. The source of transistor 110 can be coupled to $V_{DD}$ 102 while its drain can be coupled to a negative input of amplifier 120 and to node 128.

Within FIG. 1, a first terminal of resistor 124 can be coupled to node 128 while its second terminal can be coupled to the emitter of transistor 134. The collector and base of transistor 134 can be coupled to ground 130. Amplifier 120 can be coupled to $V_{DD}$ 102 and ground 130. The output of amplifier 120 can be coupled to the gates of transistors 106, 108, 110, 112 and 114. The source of transistor 112 can be coupled to $V_{DD}$ 102 while its drain can be coupled to a first terminal of resistor 122. The drain of transistor 112 can output Vref 118. A second terminal of resistor 122 can be coupled to the emitter of transistor 136 while the base and collector of transistor 136 can be coupled to ground 130. The source of transistor 114 can be coupled to $V_{DD}$ 102 while its drain can output $I_{bias}$ current 116. It is noted that the substrates of transistors 104, 106, 108, 110, 112 and 114 can be each coupled to $V_{DD}$ 102.

Note that each of transistors 104-114 and 132-136 can be implemented in a wide variety of ways in accordance with embodiments of the invention. For example, each of transistors 104-114 can be implemented as, but is not limited to, a P-channel MOSFET (metal-oxide semiconductor field-effect transistor) which is also known as a PMOS or PFET. Furthermore, each of transistors 132-136 can be implemented as, but is not limited to, a PNP bipolar transistor. It is noted that each of transistors 104-114 and 132-136 can be referred to as a switching element. Note that a gate, a drain, and a source of transistors 104-114 can each be referred to as a terminal of its transistor. Additionally, each gate of transistors 104-114 can also be referred to as a control terminal of its transistor. Also, an emitter, a base, and a collector of transistors 132-136 can each be referred to as a terminal of its transistor. Furthermore, each base of transistors 132-136 can also be referred to as a control terminal of its transistor.

It is appreciated that circuit 100 may not include all of the elements illustrated by FIG. 1. Additionally, circuit 100 can be implemented to include one or more elements not illustrated by FIG. 1. In one embodiment, it is understood that circuit 100 does not utilize resistors that are external to the integrated circuit. Instead, resistors 122 and 124 are internal to (or incorporated with, or part of) the integrated circuit. Note that offsets and/or mismatches within circuit 100 can be compensated for by any known method, such as, chopper technology or capacitive offset correction, but is not limited to such.

FIG. 3 is an exemplary table 300 in accordance with embodiments of the invention. Specifically, table 300 includes exemplary values derived from equation terms "A", "B", and "C" of Equation 11 along with corresponding Celsius temperatures and Vbe values. Note that the Vbe values corresponding with the different temperature values of table 300 were derived from graph 200 of FIG. 2. Within table 300, understand that any conversion from a temperature in degrees Celsius into a temperature in degrees Kelvin was done by adding the simplified value of 273 (instead of 273.15) to the Celsius temperature value.

As shown by table 300, the desired temperature range for this example extends from zero to 70° C. In order to produce table 300, the known or determined values for "Vbe", "Kr", "$T_c$", "k", "q", "n", and "$T_k$" corresponding to the different temperature values can be plugged into the equation terms "A", "B", and "C". Next, different values of "X" can be experimentally plugged into equation term "C" in order to determine the point at which there is minimal variation or change in the value of "(A·B)+C" across the desired temperature range. At that point, the value of X is known resulting in the knowledge of the desired ratio between resistor 124 and resistor 122 of FIG. 1. Table 300 can be utilized to analyze the linearity of quantities of "A", "B", and "C".

It is understood that the value of Vbe at each listed temperature of table 300 was utilized to determine the corresponding value of "B" at each temperature. Additionally, the value of "Kr" remained constant and equal to 0.0046 which was utilized to determine the value of "A" and the value of "C" at each temperature of table 300. Furthermore, the value of "X" was chosen to equal 7.7 and was utilized to determine the value of "C" and the value of "(A·B)+C" at each temperature of table 300.

Within FIG. 3, by utilizing 7.7 as the value for "X", table 300 shows that the lowest value of "(A·B)+C" was equal to 8.961681 while its highest value was equal to 9.077645. As such, these values demonstrate a percentage change equal to 1.293998%, which is a desirable variation over the temperature range of 0-70° C. As such, it can be seen that with a proper choice of the resistor multiplier term "X", the variation of the value of "(A·B)+C" due to a temperature coefficient can be reduced to about 1.29%. Furthermore, since Equation 11 is also power supply independent and transistor process independent, a high degree of consistency for oscillator 500 of FIG. 5 can be possible.

Figure 4:
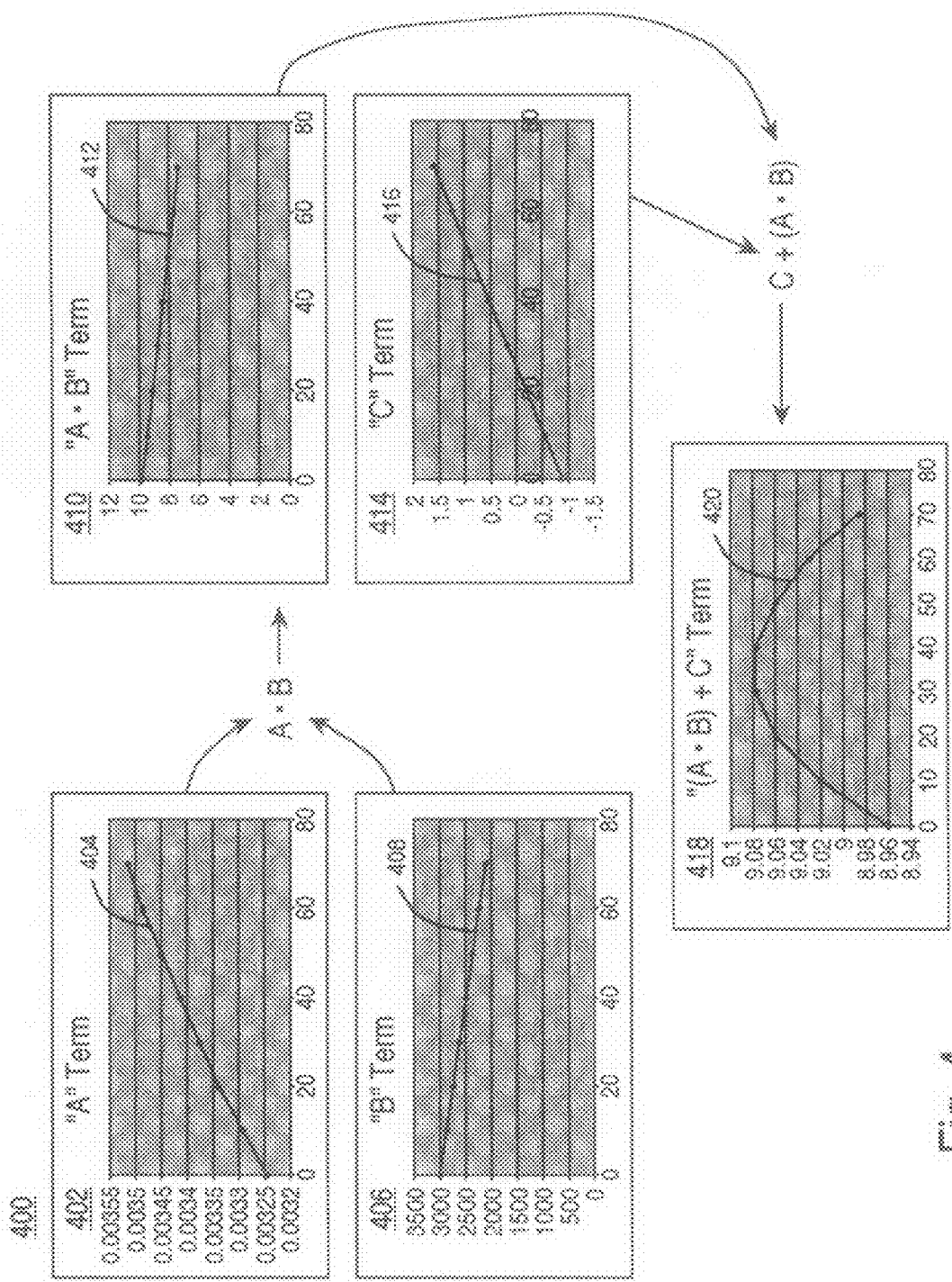
FIG. 4 is an exemplary progression diagram in accordance with embodiments of the invention.

FIG. 4 includes an exemplary progression diagram 400 in accordance with embodiments of the invention. Specifically, progression diagram 400 includes graphs 402, 406, 410, 414 and 418 that each plot values of a term from table 300 versus temperature in order to illustrate that the term is linear or mostly linear. The X-axis of each of graphs 402, 406, 410, 414 and 418 is temperature in degrees Celsius.

Graph 402 is a plot of the values of equation term "A" from table 300 versus temperature, which are connected together by a line 404. Note that line 404 has a slight curve to it, but can be considered a mostly linear term across the temperature range of 0-70° C. Additionally, graph 406 is a plot of the values of equation term "B" from table 300 versus temperature, which are connected together by a line 408. It is appreciated that line 408 can be considered a linear term across the temperature range of 0-70° C.

Within FIG. 4, progression diagram 400 shows terms "A" and "B" being multiplied and resulting in graph 410. Graph 410 is a plot of the values of equation term "A·B" from table 300 versus temperature, which are connected together by a line 412. It is understood that line 412 can be considered a mostly linear term across the temperature range of 0-70° C. Furthermore, graph 414 is a plot of the values of equation term "C" from table 300 versus temperature, which are connected together by a line 416. Note that line 416 can be considered a linear term across the temperature range of 0-70° C.

Next, progression diagram 400 shows the addition of term "A·B" with term "C" resulting in graph 418. Graph 418 is a plot of the values of equation term "(A·B)+C" from table 300 versus temperature, which are connected together by a line 420. Note that the scale of the vertical axis values of graph 418 is very small, which causes line 420 to appear non-linear. However, as previously mentioned, the values of equation term "(A·B)+C" from table 300 (which form line 420) only have a value percentage change equal to about 1.29% across the temperature range of 0-70° C. As such, line 420 can be considered a mostly linear term across the temperature range of 0-70° C.

Figure 5:
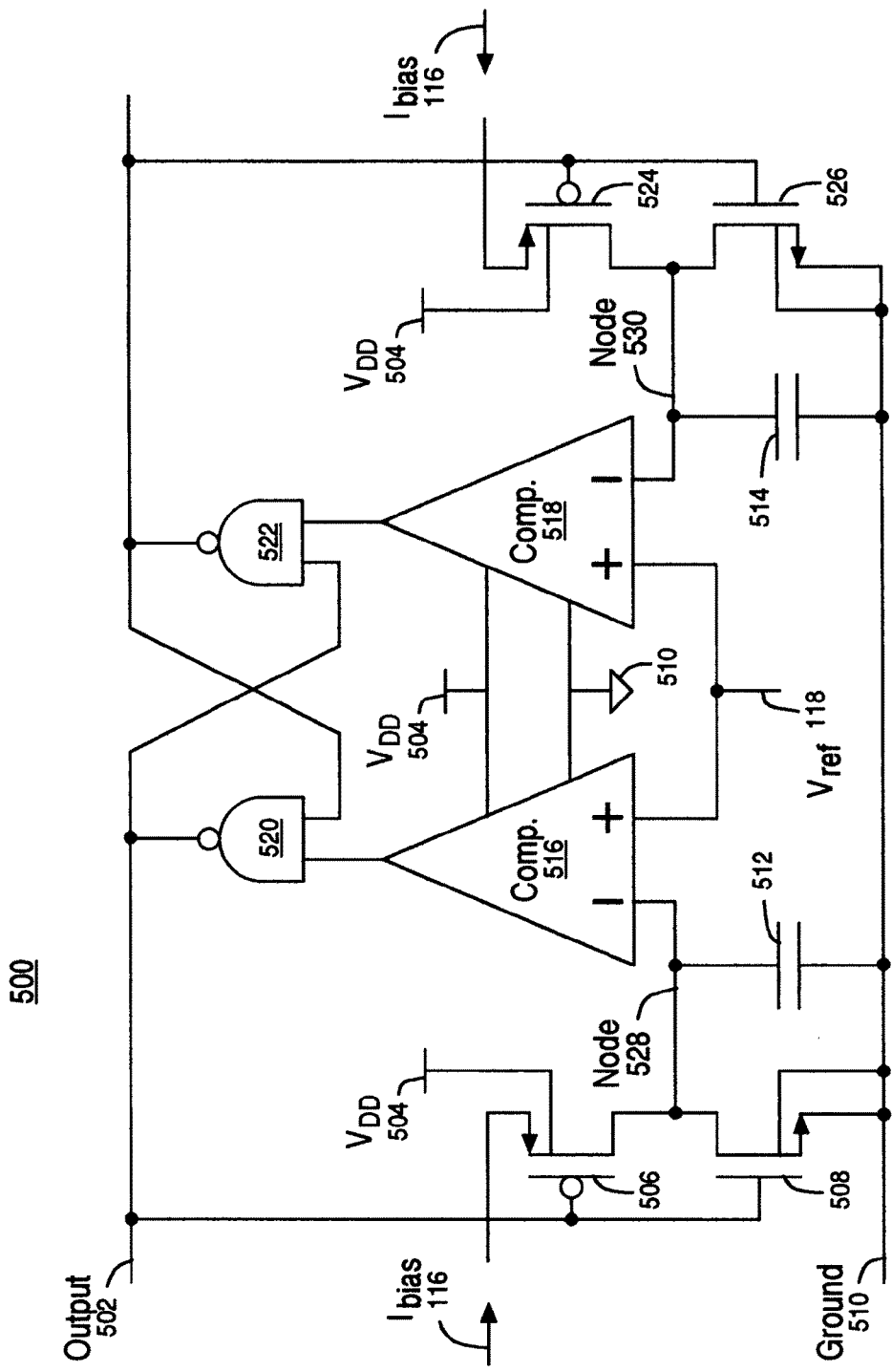
FIG. 5 is a schematic of an exemplary dual oscillator circuit in accordance with embodiments of the invention.

FIG. 5 is a schematic of an exemplary dual oscillator circuit 500 in accordance with embodiments of the invention. It is understood that dual oscillator circuit 500 can be utilized in combination with circuit 100 of FIG. 1. Specifically, dual oscillator circuit 500 can be coupled to receive voltage reference (Vref) 118 and bias current ($I_{bias}$) 116 that are output by circuit 100. Note that all of the elements of circuit 500 can be implemented as part of (or internal to) an integrated circuit chip, which may also include circuit 100. Also, circuit 500 can be referred to as an integrated circuit design. Furthermore, the combination of circuits 100 and 500 can be referred to as an integrated circuit design. Understand that in accordance with embodiments of the invention, other oscillator circuit configurations can be utilized in combination with circuit 100.

During the first half-period of dual oscillator circuit 500, a first comparator (e.g., 516) is reset and in a discharged state that is low while a second comparator (e.g., 518) is in the process of charging its ramp with $I_{bias}$ 116, which can be received from circuit 100. When its ramp voltage reaches the value of reference voltage 118, the second comparator trips (or resets) to a discharged state that is low which triggers the first comparator to begin charging its ramp with $I_{bias}$ 116. When the ramp voltage reaches the value of reference voltage 118, the first comparator trips (or resets) to a discharged state that is low which triggers the second comparator to begin charging its ramp with $I_{bias}$ 116. In this manner, this process is continually repeated. One advantage of dual oscillator circuit 500 is that the resetting of the ramp does not become a part of the cycle. The 2nd ramp can begin immediately upon the completion of the 1st ramp. The 1st ramp may take as long as half a period of the frequency of oscillator 500 to reset itself and get ready to be triggered.

Within FIG. 5, it is understood that the voltage value of node 528 is typically opposite to the voltage value of node 530. For example, when node 528 is at a high voltage (e.g., logic "1") then node 530 is at a low voltage (e.g., logic "0"), and vice versa. Furthermore, when node 528 is at a high voltage, the output of NAND gate 520 along with output 502 are at the high voltage. As such, the gates of transistors 506 and 508 are at the high voltage of output 502, which causes transistor 506 to turn "off" and transistor 508 to turn "on". With transistor 508 turned "on", the voltage of node 528 can be pulled down to ground 510. When node 530 is at a low voltage, the output of NAND gate 522 is at the low voltage. Therefore, the gates of transistors 524 and 526 are at the low voltage output by NAND gate 522, which causes transistor 524 to turn "on" and transistor 526 to turn "off". With transistor 524 turned "on", the voltage at node 530 can be pulled up by $I_{bias}$ current 116.

Conversely, when node 528 is at a low voltage (e.g., logic "0") then node 530 is at a high voltage (e.g., logic "1"). When node 528 is at a low voltage, the output of NAND gate 520 along with output 502 are at the low voltage. Consequently, the gates of transistors 506 and 508 are at the low voltage of output 502, which causes transistor 506 to turn "on" and transistor 508 to turn "off". With transistor 506 turned "on", the voltage at node 528 can be pulled up by $I_{bias}$ current 116. When node 530 is at a high voltage, the output of NAND gate 522 is at the high voltage. Therefore, the gates of transistors 524 and 526 are at the high voltage output by NAND gate 522, which causes transistor 524 to turn "off" and transistor 526 to turn "on". With transistor 526 turned "on", the voltage at node 530 can be pulled down to ground 510.

Within FIG. 5, the gates of transistors 506 and 508 can be coupled to output 502. The drains of transistors 506 and 508 can be coupled to node 528, a first terminal of capacitor 512, and a negative input of comparator circuit 516. A second terminal of capacitor 512 can be coupled to a voltage ground 510 having a low voltage value (e.g., logic "0"). The source of transistor 508 can be coupled to ground 510 while the source of transistor 506 can be coupled to receive $I_{bias}$ current 116. The positive inputs of comparators circuit 516 and 518 can be coupled to receive Vref 118. Comparators 516 and 518 can be coupled to ground 510 and to a voltage source ($V_{DD}$) 504 having a high voltage value (e.g., logic "1"). The output of comparator 516 can be coupled to a first input of logic NAND gate circuit 520 while a second input of NAND gate 520 can be coupled to the output of logic NAND gate circuit 522 and to the gates of transistors 524 and 526. The output of NAND gate 520 can be coupled to output 502, to a first input of NAND gate 522, and to the gates of transistors 506 and 508.

The output of comparator 518 can be coupled to a second input of NAND gate 522. A negative input of comparator 518 can be coupled to node 530, to a first terminal of capacitor 514, and to the drains of transistors 524 and 526. A second terminal of capacitor 514 can be coupled to ground 510. The source of transistor 526 can be coupled to ground 510 while the source of transistor 524 can be coupled to receive $I_{bias}$ current 116. It is noted that the substrates of transistors 506 and 524 can each be coupled to $V_{DD}$ 504 while the substrates of transistors 508 and 526 can each be coupled to ground 510.

Within FIG. 5, note that each of transistors 506, 508, 524 and 526 can be implemented in a wide variety of ways in accordance with embodiments of the invention. For example, each of transistors 506 and 524 can be implemented as, but is not limited to, a PMOS or PFET. Furthermore, each of transistors 508 and 526 can be implemented as, but is not limited to, an NMOS or NFET. It is noted that each of transistors 506, 508, 524 and 526 can be referred to as a switching element. Note that a gate, a drain, and a source of transistors 506, 508, 524 and 526 can each be referred to as a terminal of its transistor. Additionally, each gate of transistors 506, 508, 524 and 526 can also be referred to as a control terminal of its transistor.

It is appreciated that circuit 500 may not include all of the elements illustrated by FIG. 5. Additionally, circuit 500 can be implemented to include one or more elements not illustrated by FIG. 5.

Figure 6:
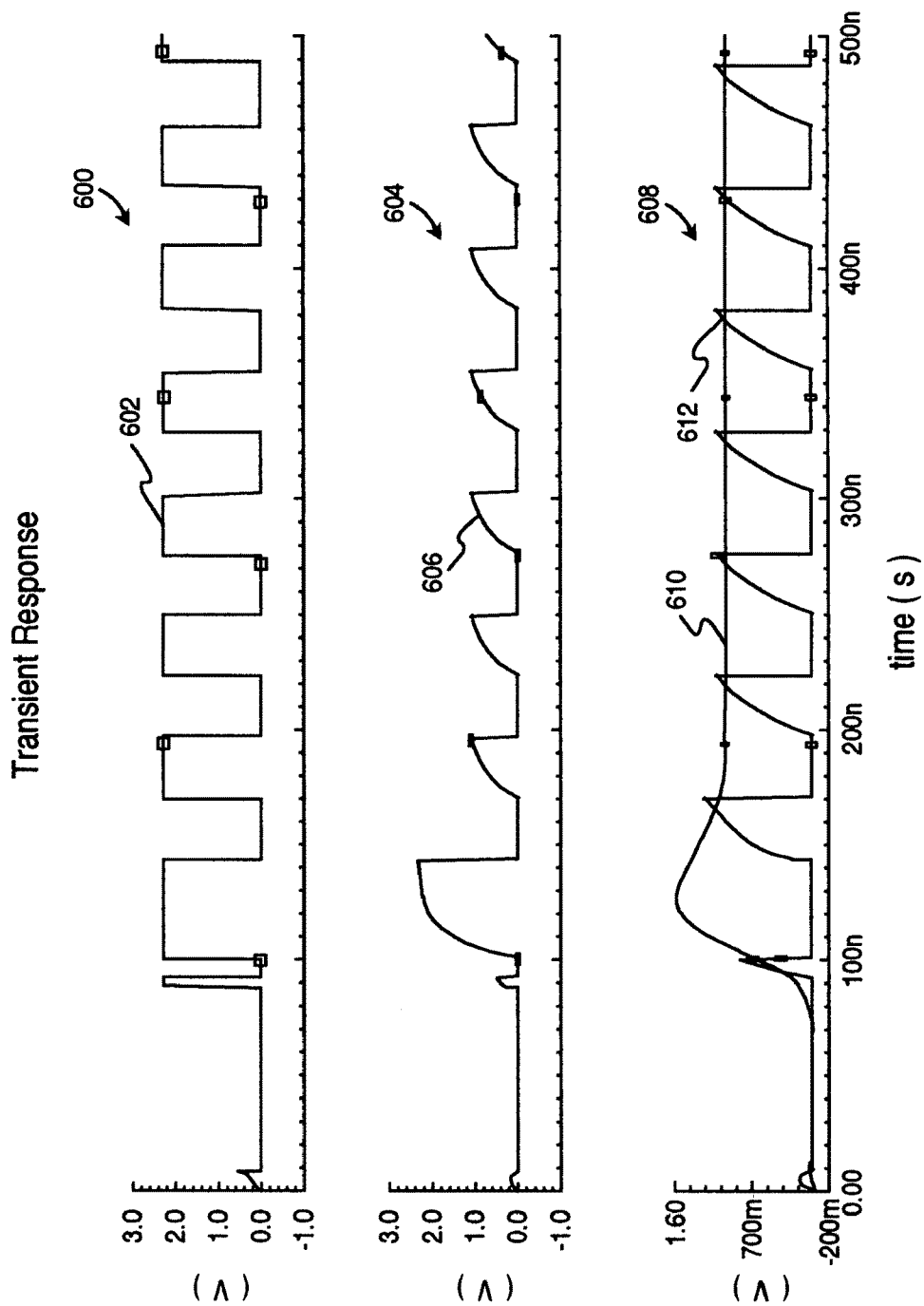
FIG. 6 includes exemplary graphs in accordance with embodiments of the invention.

FIG. 6 includes exemplary graphs 600, 604, and 608 in accordance with embodiments of the invention. Specifically, FIG. 6 includes graphs 600, 604, and 608 that are associated with dual oscillator circuit 500.

For example, graph 604 illustrates an exemplary transient voltage response signal 606 that can be produced at node 528 by the left side of dual oscillator circuit 500. Furthermore, graph 608 illustrates an exemplary transient voltage response signal 612 that can be produced at node 530 by the right side of dual oscillator circuit 500. Graph 608 also illustrates an exemplary trip point threshold voltage signal 610 that corresponds with reference voltage 118. It is noted that transient voltage response signal 612 of graph 608 and transient voltage response signal 606 of graph 604 are 180 degrees out of phase.

Within FIG. 6, graph 600 illustrates an exemplary transient voltage response output signal 602 that can be produced at output 502 of dual oscillator circuit 500. It is noted that output signal 602 is in phase with transient voltage response signal 606 of graph 604 while output signal 602 is 180 degrees out of phase with transient voltage response signal 612 of graphs 608.

Figure 7:
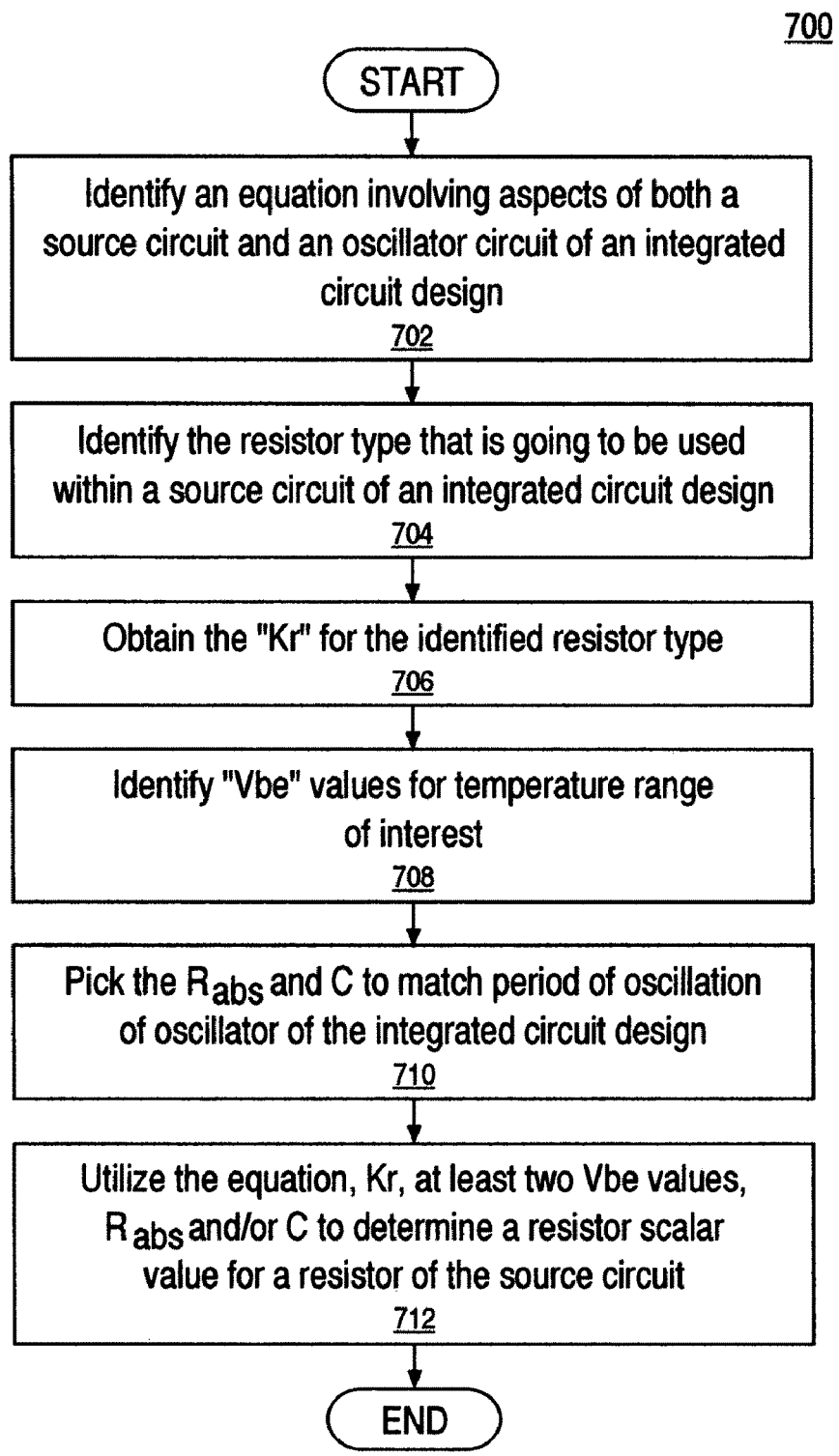
FIG. 7 is a flowchart of an exemplary method in accordance with embodiments of the invention.

FIG. 7 is a flowchart of a method 700 in accordance with embodiments of the invention. Method 700 includes exemplary processes of embodiments of the invention which can be carried out by a processor(s) and electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 700, such operations are exemplary. That is, method 700 may not include all of the operations illustrated by FIG. 7. Alternatively, method 700 may include various other operations and/or variations of the operations shown by FIG. 7. Likewise, the sequence of the operations of method 700 can be modified. It is noted that the operations of method 700 can each be performed by software, by firmware, by electronic hardware, or by any combination thereof.

Specifically, an equation can be identified that involves at least one aspect of a source circuit and an oscillator circuit of an integrated circuit design. Additionally, the resistor type can be identified that is going to be used within the source circuit. The resistor temperature coefficient ("Kr") can be obtained that corresponds with the identified resistor type. The Vbe values for one or more bipolar transistors of the source circuit can be identified for a temperature range of interest. The absolute resistance ($R_{abs}$) and capacitance (C) can be picked to match the period of oscillation of the oscillator circuit. The equation, the reference temperature coefficient, at least two Vbe values, the absolute resistance and/or the capacitance can be utilized to determine a resistor scalar value for a resistor of the source circuit such that the source circuit is substantially unaffected by variations in temperature and power supply variations and variations in an integrated circuit transistor fabrication process.

At operation 702 of FIG. 2, an equation (e.g., Equation 11) can be identified that involves at least one aspect of a source circuit (e.g., 100) and an oscillator circuit (e.g., 500) of an integrated circuit design. Operation 702 can be implemented in a wide variety of ways. For example, operation 702 can be implemented in any manner similar to that described herein, but is not limited to such.

At operation 704, the resistor type can be identified that is going to be used within or as part of the source circuit. Operation 704 can be implemented in a wide variety of ways. For example, operation 704 can be implemented in any manner similar to that described herein, but is not limited to such.

At operation 706 of FIG. 7, the resistor temperature coefficient ("Kr") can be obtained that corresponds with the identified resistor type. Operation 706 can be implemented in a wide variety of ways. For example, operation 706 can be implemented in any manner similar to that described herein, but is not limited to such.

At operation 708, the Vbe values for one or more bipolar transistors (e.g., 136) of the source circuit can be identified for a temperature range of interest. Operation 708 can be implemented in a wide variety of ways. For example, operation 708 can be implemented in any manner similar to that described herein, but is not limited to such.

At operation 710 of FIG. 7, the absolute resistance ($R_{abs}$) and capacitance (C) can be picked to match the period of oscillation of the oscillator circuit. Operation 710 can be implemented in a wide variety of ways. For example, operation 710 can be implemented in any manner similar to that described herein, but is not limited to such.

At operation 712, the equation, the reference temperature coefficient, at least two Vbe values, the absolute resistance and/or the capacitance can be utilized to determine a resistor scalar value (e.g., "X") for a resistor (e.g., 122) or resistance of the source circuit such that the source circuit is substantially unaffected by variations in temperature and power supply variations and variations in an integrated circuit transistor fabrication process. Operation 712 can be implemented in a wide variety of ways. For example, operation 712 can be implemented in any manner similar to that described herein, but is not limited to such. Upon completion of operation 712, process 700 can be ended.

The foregoing descriptions of specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. An integrated circuit chip comprising:
   a bandgap reference circuit for outputting a reference voltage and a bias current, wherein said reference voltage changes by a substantially same proportion as said bias current, said bandgap reference circuit comprises a first resistor and a second resistor; and
   an oscillator circuit coupled to receive said reference voltage and said bias current from said bandgap reference circuit, said oscillator circuit is coupled to said second resistor of said bandgap reference circuit, said oscillator circuit for outputting an oscillating electrical signal;
   wherein an equation involving aspects of both said bandgap reference circuit and said oscillator circuit is utilized to determine a scalar value for said second resistor of said bandgap reference circuit such that said bandgap reference circuit is substantially unaffected by variations in temperature and power supply variations and variations in an integrated circuit transistor fabrication process.

2. The integrated circuit chip of claim 1, wherein said bandgap reference circuit comprises a transistor coupled to said second resistor; and wherein said equation comprises a base-emitter voltage of said transistor.

3. The integrated circuit chip of claim 1, wherein said equation comprises a temperature coefficient of said first resistor.

4. The integrated circuit chip of claim 1, wherein said equation comprises a change in degrees Celsius.

5. The integrated circuit chip of claim 1, wherein said equation comprises a temperature in degrees Kelvin.

6. The integrated circuit chip of claim 1, wherein said equation comprises an electron charge value.

7. An integrated circuit chip comprising:
   a bandgap reference circuit for generating a reference voltage and a bias current, wherein said reference voltage changes by a substantially same proportion as said bias current, said bandgap reference circuit comprises a first resistor, a second resistor, a first transistor, a second transistor and an amplifier, wherein said first transistor and said first resistor are coupled to a first input of said amplifier and said second transistor is coupled to a second input of said amplifier; and
   an oscillator coupled to receive said reference voltage and said bias current, said oscillator is coupled to said second resistor of said bandgap reference circuit, said oscillator for outputting an oscillating electrical signal;
   wherein an equation involving aspects of both said bandgap reference circuit and said oscillator circuit is utilized to determine a scalar value for said second resistor of said bandgap reference circuit such that said bandgap reference circuit is substantially unaffected by variations in temperature and power supply variations and variations in an integrated circuit transistor fabrication process.

8. The integrated circuit chip of claim 7, wherein said bandgap reference circuit comprises a third transistor coupled to said second resistor; and wherein said equation comprises a base-emitter voltage of said third transistor.

9. The integrated circuit chip of claim 8, wherein said equation comprises a temperature coefficient of said first resistor.

10. The integrated circuit chip of claim 9, wherein said equation comprises a change in degrees Celsius.

11. The integrated circuit chip of claim 10, wherein said equation comprises a temperature in degrees Kelvin.

12. The integrated circuit chip of claim 11, wherein said equation comprises an electron charge value.

* * * * *